United States Patent [19]
Tang

[11] Patent Number: 6,069,825
[45] Date of Patent: May 30, 2000

[54] CHARGE PUMP FOR WORD LINES IN PROGRAMMABLE SEMICONDUCTOR MEMORY ARRAY

[75] Inventor: Kam-Fai Tang, Fremont, Calif.

[73] Assignee: Turbo IC, Inc., San Jose, Calif.

[21] Appl. No.: 09/154,062

[22] Filed: Sep. 16, 1998

[51] Int. Cl.$^7$ .................................................. G11C 16/04
[52] U.S. Cl. ............................. 365/185.27; 365/185.23; 365/189.09
[58] Field of Search ..................... 365/185.25, 185.23, 365/185.27, 189.09, 204

[56] References Cited

U.S. PATENT DOCUMENTS

| | | | |
|---|---|---|---|
| 4,511,811 | 4/1985 | Gupta . | |
| 4,673,829 | 6/1987 | Gupta . | |
| 4,701,637 | 10/1987 | Piro | 307/297 |
| 4,811,292 | 3/1989 | Watanabe . | |
| 4,823,317 | 4/1989 | Brahmbhatt | 365/189 |
| 4,831,589 | 5/1989 | Brahmbhatt | 365/189.09 |
| 5,394,365 | 2/1995 | Tsukikawa | 365/189.09 |

*Primary Examiner*—Richard Elms
*Assistant Examiner*—Hien Nguyen
*Attorney, Agent, or Firm*—Andrei D. Popovici

[57] ABSTRACT

A self-decoding charge pump for charging word lines or bit lines of a semiconductor memory array such as an EEPROM includes a passive, parallel-plate ONO capacitor for coupling voltage pulses generated by an oscillator to a charge transfer node. The voltage pulses received at the charge transfer node control the transfer of increments of charge from a high-voltage generator to a selected word line. Large-area capacitive coupling may be used without causing significant carrier injection into the substrate. In one configuration exploiting the floating-gate EEPROM semiconductor geometry, plural stacked capacitors are used, allowing a doubling of the capacitance per surface area relative to a single-capacitor configuration. Plural oscillators generating lower-amplitude signals can be used with one high-voltage generator.

10 Claims, 3 Drawing Sheets

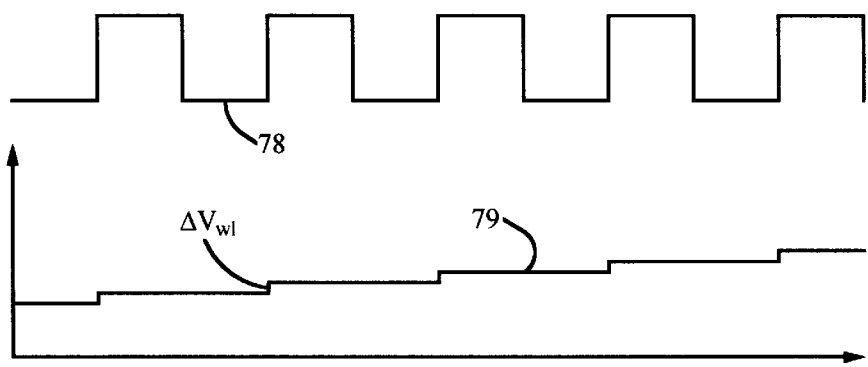
FIG. 3
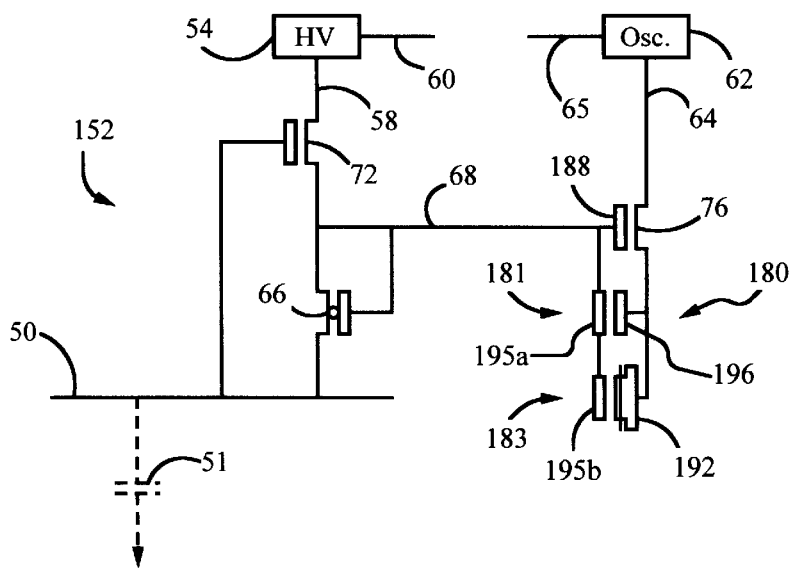
FIG. 4-A
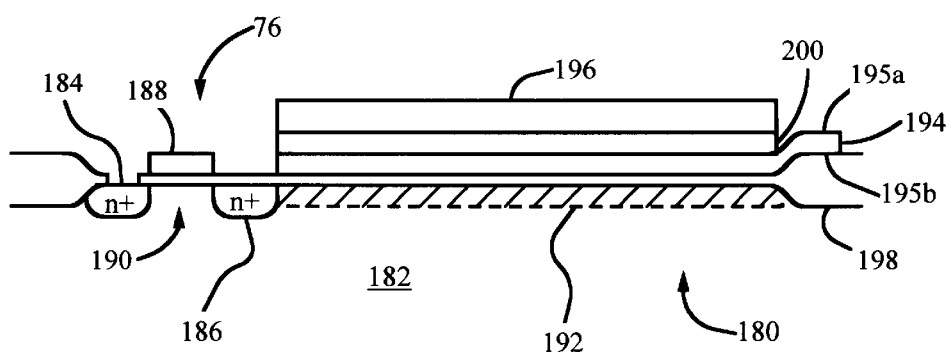
FIG. 4-B

CHARGE PUMP FOR WORD LINES IN PROGRAMMABLE SEMICONDUCTOR MEMORY ARRAY

BACKGROUND

This invention relates to semiconductor memory arrays, and in particular to charge pumps for providing programming voltages to conductive lines such as word lines and bit lines in programmable semiconductor memory arrays such as electrically erasable read-only memories (EEPROM).

Programming floating-gate non-volatile semiconductor memories such as EEPROMs typically involves charging up memory word lines (x-lines) and bit lines selected for programming. Specialized on-chip charge pumps can be used for selectively charging selected word lines and bit lines. As the space between the high-voltage nodes and the carrier injection points of the charge pump circuit decreases, the problem of carrier injection into the circuit substrate increases in importance. Carrier injection or escape occurs when conductive channels in active devices are driven to switch potential from high to low or low to high. Carrier injection into the circuit substrate and subsequent migration of electrons to the high-voltage nodes of the circuit can significantly degrade the pumping efficiency of the charge pumps.

SUMMARY

It is a primary object of the present invention to provide a charge pump with reduced carrier injection, for charging up word lines or bit lines of a semiconductor memory array during programming. It is another object to provide a charge pump that selectively allows the transfer of charge from the programming voltage source only to selected word lines or bit lines. It is yet another object to provide a charge pump allowing a reduction in carrier injection into the circuit substrate.

The present invention provides an improved apparatus integrated on a chip for selectively charging conductive lines of a programmable non-volatile memory array. The apparatus comprises a conductive line decoder for selecting a conductive line for programming; a high voltage generator for generating a high voltage; an oscillator for generating voltage pulses; capacitive circuitry connected to a charge transfer node corresponding to the conductive line, for capacitively coupling the voltage pulses to the charge transfer node; oscillator output control circuitry connected to the oscillator and the capacitive circuitry, and responsive to the conductive line decoder, for transmitting the voltage pulses to the capacitive circuitry only if the conductive line is selected for programming; and selective charge transfer circuitry connecting the high-voltage generator and the conductive line, and coupled to the charge transfer node, for selectively transferring charge increments from the high-voltage generator to the conductive line in response to the voltage pulses received at the charge transfer node.

DESCRIPTION OF THE FIGURES

FIG. 3 illustrates the incremental charging of a selected word line in response to oscillator voltage pulses coupled through the capacitive circuit of FIG. 2, according to the present invention.

FIG. 4-A illustrates an alternative charge pump circuit of the present invention, including an alternative capacitive circuit.

FIG. 4-B is a side view of the preferred semiconductor structure of the capacitive circuit illustrated in FIG. 4-A, according to the present invention.

DETAILED DESCRIPTION

In the following description, the statement that a capacitive circuit or capacitor is "passive" is understood to mean that the capacitive circuit/capacitor is formed by passive conductive surfaces and dielectrics which do not include substantial junction and surface inversion layer areas which would otherwise induce carrier injection. Unless stated otherwise, the term "conductive line" is understood to refer to word lines and bit lines.

The following description illustrates embodiments of the invention by way of example and not necessarily by way of limitation.

Figure 1:
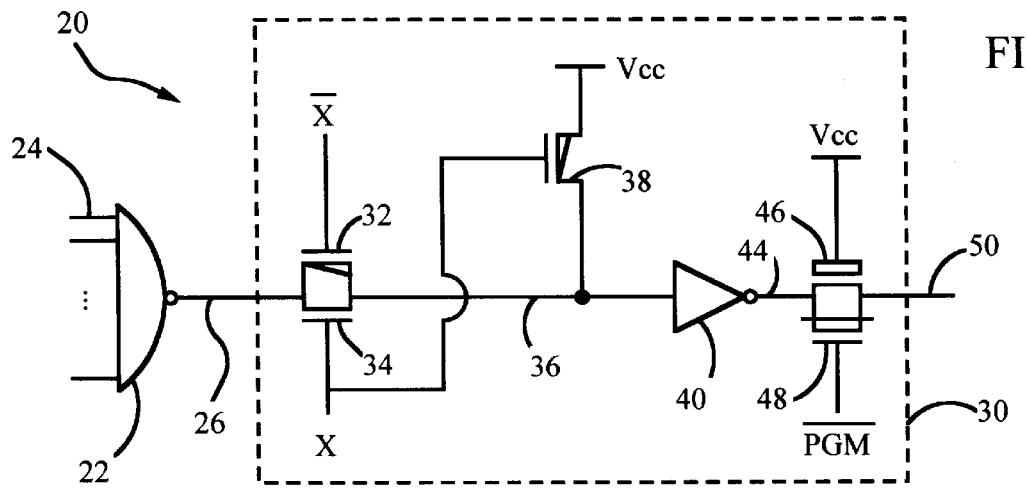
FIG. 1 shows a preferred word line pre-decoder and decoder, according to the present invention.

FIG. 1 shows a preferred pre-decoding/decoding circuit 20 of the present invention. Circuit 20 comprises a NAND gate 22 serving as a word line pre-decoder. Gate 22 has multiple address line inputs 24 and a single pre-decoder output 26.

Pre-decoder output 26 is selected (logic 0 level) when all inputs 24 are selected, and it is de-selected (logic 1 level) if any of inputs 24 is de-selected.

Pre-decoder output 26 is connected to an input of a word line decoder circuit 30. Decoder circuit 30 comprises an enhancement p-channel device 32 and an enhancement n-channel device 34. The sources of devices 32 and 34 are connected to pre-decoder output 26, and the drains of devices 32, 34 are connected to an internal decoder node 36. The gates of devices 32, 34 are connected to external X and $\overline{X}$ decoder inputs, respectively. The signals X and $\overline{X}$ are generated by a conventional multiple level decoding circuit, and are derived from X-address lines other than those used for inputs 24.

An enhancement p-channel device 38 has its source connected to Vcc=5V, its drain connected to node 36, and its gate connected to the X input. Device 38 serves as a de-select device. An inverter 40 has its input connected to node 36, and its output connected to a node 44. Node 44 is connected to the common sources of an enhancement device 46 and a depletion (−1 V threshold) device 48. The gates of devices 46 and 48 are connected to Vcc and to a $\overline{PGM}$ input, respectively. The common drains of devices 46, 48 are connected to a word line 50.

Decoder 30 receives signals X, $\overline{X}$, $\overline{PGM}$, and a signal from pre-decoder output 26 as its inputs, and generates an output signal on word line 50. Decoder 30 can be better understood by considering its operation when word line 50 is selected and de-selected.

When word line 50 is to be de-selected, $\overline{X}$ is charged to Vcc, X is pulled to ground, and $\overline{PGM}$ remains unchanged at Vcc.

Devices 32 and 34 are cut off so the signal at node 26 does not pass on to node 36. Device 38 is turned on by the X signal at its gate, and pulls up node 36 to Vcc. Inverter 40 sets node 44 to ground. Device 46 is on, as long as both word line 50 and node 44 are under Vcc. Devices 46 and 48 pull word line 50 to the voltage of node 44, which is ground.

When word line 50 is to be selected, $\overline{X}$ is pulled to ground, X is charged to Vcc, and $\overline{PGM}$ remains unchanged at Vcc.

Node 26 is at ground. Devices 32 and 34 are on, and device 38 is off. The signal at node 26 passes on to node 36 through devices 32 and 34. Inverter 40 sets node 44 to Vcc. Devices 46 and 48 are on, and charge word line 50 to Vcc.

At the onset of programming, $\overline{PGM}$ is discharged to ground. Device 48 is then off. Word line 50 remains at Vcc due to its inherent capacitance, illustrated as a capacitor 51 in FIG. 2. Referring back to FIG. 1, when word line 50 is pumped to higher voltages as described below, device 46 prevents charge from flowing from word line 50 to node 44. Device 46 operates in a tri-state mode during programming.

Figure 2:
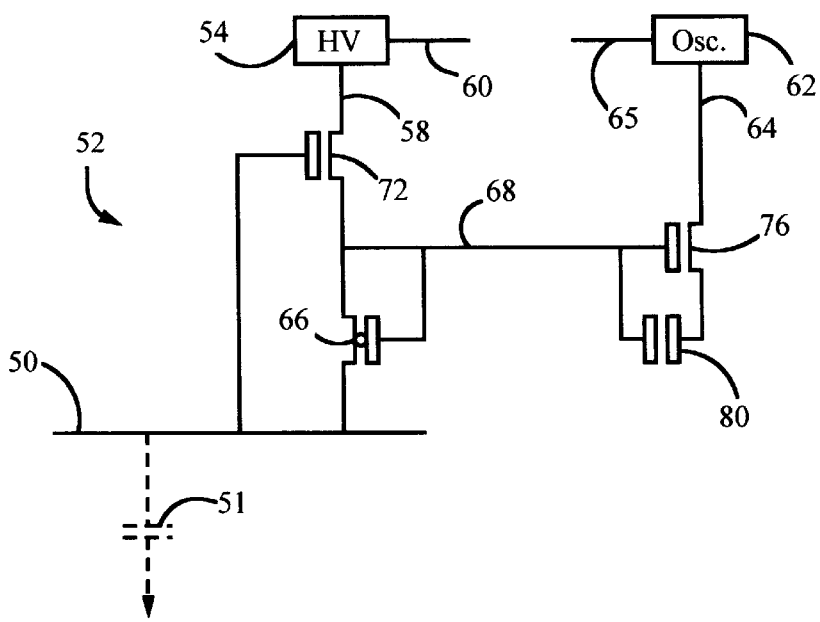
FIG. 2 shows a preferred charge pump circuit of the present invention, including a preferred capacitive circuit of the present invention.

FIG. 2 shows a preferred self-decoding charge pump circuit 52 of the present invention. Charge pump 52 comprises an on-chip high-voltage generator circuit 54 for generating a high voltage Vhv (Vhv=10–20 V, Vhv>Vcc) at a high-voltage generator output 58. High-voltage generator 54 is connected to on-chip or off-chip control logic (not shown) through a control line 60, for receiving enable signals controlling generator 54 to turn on/off. Charge pump 52 further comprises an on-chip oscillator circuit 62 for generating voltage pulses of amplitude Vosc=Vcc at an oscillator output 64. The output of oscillator 62 is a square wave varying between 0 V and Vosc, with a frequency on the order of several hundred kHz to 10 MHz and finite rise/fall times. Oscillator 62 is connected to on-chip or off-chip control logic over a control line 65, for receiving enable signals controlling oscillator 62 to turn on/off. Suitable high-voltage generators, oscillators, and corresponding control circuits are well known in the art.

A first charge transfer control device 66 has its source connected to word line 50, and its gate and drain connected together to a charge transfer node 68. Device 66 is an n-channel enhancement device with a threshold voltage Vt1 between 0 V and 0.3 V. A second charge-transfer control device 72 has its drain, gate, and source connected to high-voltage generator output 58, word line 50, and charge transfer node 68, respectively. Device 72 is an enhancement device with a threshold voltage Vt2 between 0.4 V and 1.5 V, for example 1 V. An oscillator-output control device 76 has its drain connected to oscillator output 64, and its gate connected to charge transfer node 68. Device 76 is an enhancement device with a threshold voltage Vt3 between 0.4 V and 1.5 V, for example 1 V.

A capacitive circuit consisting of a passive capacitor 80 has an input connected to the source of device 76, and an output connected to charge transfer node 68. Capacitor 80 is a large-area, in-plane parallel plate capacitor having an ONO (silicon dioxide, silicon nitride, silicon dioxide) dielectric sandwiched between top and bottom polysilicon plates. Other suitable dielectrics include silicon dioxide (e.g. gate oxide), silicon nitride, and aluminum oxide. The surface area of capacitor 80 is preferably at least an order of magnitude (factor of 10) larger than the gate area of device 76. The use of a passive capacitor for capacitively coupling oscillator output 64 to charge transfer node 68 allows a reduction in carrier injection into the semiconductor substrate. Such carrier injection could lead to reduced pumping efficiency for charge pump 52, particularly if a large gate surface area were to be used to increase the capacitive coupling between oscillator output 64 and charge transfer node 68.

When word line 50 is de-selected, device 66 discharges charge transfer node 68 to word line 50 (ground). Device 72 is off, isolating generator output node 58 from charge transfer node 68. Similarly, device 76 is off, isolating oscillator output 64 from capacitor 80 and charge transfer node 68. Thus, unselected word lines do not draw substantial amounts of current from generator 58 or oscillator 64. Moreover, as long as the threshold voltage Vt3 of device 76 is larger than the threshold voltage Vt1 of device 66, spurious charge accumulation on charge transfer node 68 does not trigger pumping of word line 50 when word line 50 is de-selected.

During programming set-up, word line 50 is selected and charged to Vcc (5 V) by decoder 30. As programming signal $\overline{PGM}$ goes low, generator 54 and oscillator 62 are turned on by enable signals received over connections 60 and 65, respectively. Device 72 initializes charge transfer node 68 to one threshold Vt2 below word line 50 (~4 V). Device 66 is off since its drain and gate voltages (~4 V) are below its source voltage (~5 V). Device 76 is on, and its source and drain are initially at ground. There is a ~4 V voltage across capacitor 80.

As oscillator output 64 ramps up from ground, device 76 allows the input of capacitor 80 to be charged. As the input of capacitor 80 charges up, the voltage on charge transfer node 68 is capacitively coupled up, primarily through capacitor 80. As the voltage on charge transfer node 68 increases beyond the sum of the voltage on word line 50 (initially 5 V) and the threshold voltage Vt1 of device 66, device 66 begins charging word line 50.

Word line 50 is charged through device 66 until oscillator output 64 achieves its maximum voltage. As the voltage on oscillator output 64 decreases, device 72 transfers charge from high-voltage generator output 58 to charge transfer node 68, preventing charge transfer node 68 from decreasing to its previous level. When oscillator output 64 reaches ground at the end of a cycle, the voltages on charge transfer node 68 and word line 50 are higher than at the beginning of the cycle.

FIG. 3 illustrates the incremental charging of word line 50 over a number of cycles of oscillator 62. The upper square wave 78 represents the voltage at oscillator output 64, while the lower stairstep 79 represents the voltage on word line 50. The voltage on word line 50 raises incrementally by a voltage difference $\Delta V_{w1}$ for each positive voltage swing at oscillator output 64. On the negative oscillator output voltage swing at the end of a cycle, the transfer of a charge increment from high-voltage generator 54 to charge transfer node 68 prevents the voltage on charge transfer node 68 from returning from its value at the start of the cycle. At the same time, device 66 prevents the discharge of word line 50 to the voltage of charge transfer node 68.

The positive voltage swing at oscillator output 64 can be broken down into two parts: a first voltage swing $\Delta V_{osc1}$ while device 66 is off, and a second voltage swing $\Delta V_{osc2} = V_{CC} - \Delta V_{osc1}$ while device 66 is on. The voltage swing $\Delta V_{osc1}$ required on oscillator output 64 to raise the initial potential of charge transfer node 68 by a voltage difference $\Delta V_{ctn}$ while device 66 is off is $$\Delta V_{osc1} = \Delta V_{ctn}(C_{eq}(76,80) + C(66))/C_{eq}(76,80), \quad [1a]$$

where $C_{eq}(76,80)$ is the equivalent capacitance of device 76 and capacitor 80 as measured between oscillator output 64 and charge transfer node 68, and $C(66)$ is the gate-to-substrate capacitance of device 66. The voltage swing required on oscillator output 64 for raising the potential of word line 50 by ~1 V (Vt1+Vt2, i.e. until device 66 starts charging word line 50) is $$\Delta V_{osc1} = 1V(C_{eq}(76,80) + C(66))/C_{eq}(76,80). \quad [1b]$$

After device 66 starts charging word line 50, oscillator output 64 undergoes a remaining voltage swing $$\Delta V_{osc2} = V_{cc} - \Delta V_{osc1}.\qquad [2]$$

The incremental increase in the potential of word line 50 per positive oscillator voltage swing is then $$\Delta V_{w1} \cong (V_{cc} - \Delta V_{osc1})C_{eq}(76,80)/(C_{eq}(76,80)+C(51)),\qquad [3]$$

where C(51) is the inherent capacitance of word line 50, illustrated as capacitor 51 in FIG. 2. If $$C(51) >> C_{eq}(76,80),\qquad [4]$$

eq. [3] becomes $$\Delta V_{w1} \cong (V_{cc} - V_{t2} - V_{t1})C_{eq}(76,80)/C(51),\qquad [5]$$

where $V_{t2}$ is the threshold voltage of device 72 and $V_{t1}$ is the threshold voltage of device 66.

From the preceding discussion, it can be seen that device 72 serves to control the transfer of charge from high-voltage generator 54 to charge transfer node 68 when word line 50 is selected, and to prevent the transfer of charge from high-voltage generator 54 to charge transfer node 68 when word line 50 is de-selected. Thus, device 72 ensures that high-voltage generator 54 does not leak current through de-selected word lines.

Device 66 serves to control the transfer of charge from charge transfer node 68 to word line 50 when word line 50 is selected, and in particular to prevent the transfer of charge from word line 50 to charge transfer node 68 on the negative voltage swings of oscillator 62. Device 66 further serves to ground charge transfer node 68 when word line 50 is de-selected, thus cooperating with device 76 to isolate oscillator 62 from capacitor 80 when word-line 50 is de-selected. Device 76 serves to control the coupling of oscillator output 64 to charge transfer node 68. Device 76 allows the voltage pulses generated by oscillator 62 to pass on to capacitor 80 and charge transfer node 68 only if word line 50 is selected.

The capacitive coupling between oscillator output 64 and charge transfer node 68 occurs primarily through capacitor 80, although there may be some limited gate-to-drain capacitive coupling through device 76. The relatively large capacitance of capacitor 80 allows the use of a small device 76, and allows limiting the carrier injection produced by device 76. In the preferred embodiment, capacitor 80 has a capacitance on the order of 500 nF, while device 76 has a capacitance on the order of 0.03 pF. By contrast, if the gate surface of an active device such as device 76 were to be used for capacitively coupling oscillator output 64 to charge transfer node 68, the large gate surface area required for obtaining a desired capacitance would lead to significantly increased carrier injection. Carrier injection is of increasing concern for charge pump circuit manufactured using more advanced sub-micron technology, for which the injection locations become closer to the high-voltage nodes of the charge pump circuit.

FIG. 4-A shows a charge pump 152 having an alternative capacitive circuit 180. Capacitive circuit 180 is defined by two capacitors 181 and 183 connected in parallel. The equivalent capacitance of capacitive circuit 180 is equal to the sum of the individual capacitances of capacitors 181 and 183. Capacitors 181 and 183 are physically stacked on top of each other, allowing circuit 180 to occupy the chip surface area that a single capacitor 181 or 183 would occupy in isolation.

FIG. 4-B is a side sectional view showing the semiconductor structure of capacitive circuit 180 and device 76. Capacitive circuit 180 and device 76 are defined in adjacent regions on a semiconductor p-type substrate 182. Device 76 includes an n-type drain region 184, an n-type source region 186, and a polysilicon gate 188 deposited on silicon dioxide above a conductive channel 190 defined between drain region 184 and source region 186. Drain region 184 is at the same potential as oscillator output 64. Capacitive circuit 180 is defined by a plurality of stacked layers: a planar n-type ion implant region 192 formed in substrate 182, a middle polysilicon plate 194, and a second polysilicon plate 196. Top and bottom surfaces 195a–b of plate 194 face plate 196 and region 192, respectively. An interpolysilicon layer 200 serves as a dielectric between plates 194 and 196. A silicon dioxide layer 198 serves as a dielectric between n-type ion implant region 192 and plate 194. All layers are oriented along the major surface of substrate 182.

Ion implant region 192 and plate 196 are electrically connected to source region 186 (the source of device 76). Plate 194 is electrically connected to charge transfer node 68. Capacitor 181 is defined between plate 196 and top surface 195a of plate 194. Capacitor 183 is defined between region 192 and bottom surface 195b of plate 194.

The arrangement illustrated in FIG. 4-B exploits the geometry of conventional non-volatile floating gate memories, which makes use of two stacked polysilicon layers. The illustrated arrangement allows a doubling of the capacitance per substrate surface area, as compared to an arrangement having only two stacked capacitor plates. The reduction in the surface area of ion implant region 192 allows a reduction in the carrier escape from ion implant region 192.

Figure 5:
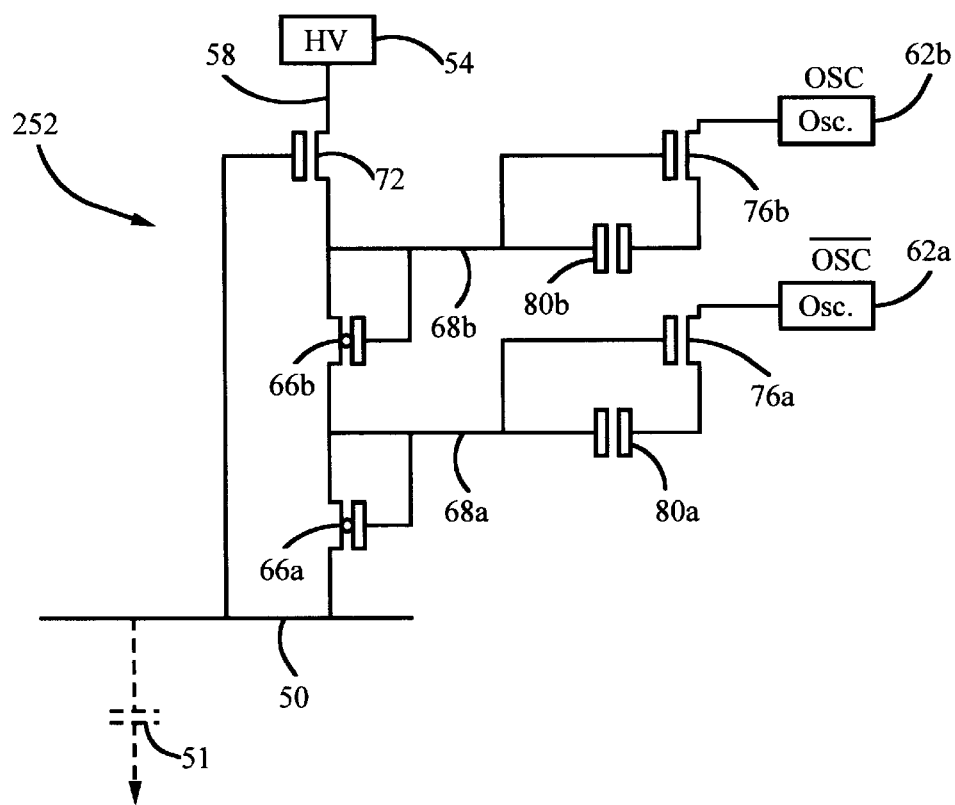
FIG. 5 illustrates another alternative charge pump circuit of the present invention.

FIG. 5 shows a charge pump 252 comprising plural oscillators for controlling the transfer of charge from high-voltage generator 64 to word line 50, according to an alternative embodiment of the present invention. Charge pump 252 comprises plural charge transfer nodes 68a–b connected in series between high-voltage generator 54 and word line 50. Charge transfer nodes 68a–b are connected as described above to corresponding oscillators 62a–b through capacitors 80a–b and devices 76a–b, respectively. Oscillators 62a–b generate out-of-phase voltage pulses OSC and $\overline{\text{OSC}}$, respectively. The drain and gate of device 66a are connected to charge transfer node 68a, while the source of device 66a is connected to word line 50. The gate and drain of device 66b are connected to charge transfer node 68b, while the source of device 66b is connected to charge transfer node 68a. Device 66b controls the connection between charge transfer nodes 68a and 68b. The drain and source of device 72 are connected to high-voltage generator output 58 and charge transfer node 68b, respectively. Device 72 controls the connection between high-voltage generator output 58 and charge transfer node 68b.

The devices connected to charge transfer nodes 68a–b cooperate in a push-pull fashion to generate a relatively large voltage swing across device 66b, relative to the voltage swing across device 66 illustrated in FIG. 2. Charge is first transferred from high-voltage generator output 58 to charge transfer node 68b, subsequently from charge transfer node 68b to charge transfer node 68a, and subsequently from charge transfer node 68a to word line 50.

The configuration of FIG. 5 allows the use of oscillator voltage pulses of smaller amplitude than the configuration of FIG. 2. As illustrated by eq. [5], charging word line 50 in the configuration of FIG. 2 requires that the oscillator output voltage be higher than the sum of the threshold voltages of devices 66 and 72. Moreover, the threshold voltage of device 66 increases with the voltage on word line 50. The configuration of FIG. 5 can be used to relax the constraint imposed on the oscillator output voltage swing by the threshold voltage of device 66.

It will be clear to one skilled in the art that the above embodiments may be altered in many ways without departing from the scope of the invention. For example, a device connecting a high-voltage generator output to a charge transfer node may be a native device. A device connecting a charge transfer node to a word line may be an enhancement device. P-channel. devices may be used instead on n-channel devices. Accordingly, the scope of the invention should be determined by the following claims and their legal equivalents.

What is claimed is:

1. An apparatus integrated on a chip for selectively charging conductive lines of a programmable non-volatile memory array, comprising:
    a) a conductive line decoder for selecting at least one of said conductive lines for programming;
    b) a high voltage generator for generating a high voltage;
    c) an oscillator for generating voltage pulses;
    d) capacitive circuitry connected to a charge transfer node corresponding to said at least one of said conductive lines, for capacitively coupling said voltage pulses to said charge transfer node;
    e) oscillator output control circuitry connected to said oscillator and said capacitive circuitry, and responsive to said conductive line decoder, for transmitting said voltage pulses to said capacitive circuitry only if said at least one of said conductive lines is selected for programming; and
    f) selective charge transfer circuitry connecting said high-voltage generator and said at least one of said conductive lines, and coupled to said charge transfer node, for selectively transferring charge increments from said high-voltage generator to said at least one of said conductive lines in response to said voltage pulses received at said charge transfer node.

2. The apparatus of claim 1 wherein said capacitive circuitry comprises a passive parallel-plate capacitor.

3. The apparatus of claim 1 wherein said capacitive circuitry comprises at least two capacitors connected in parallel, said at least two capacitors being defined between three stacked parallel plates oriented substantially along a major surface of a substrate of said chip.

4. The apparatus of claim 1 wherein said oscillator output control circuitry comprises a device having a gate connected to said charge transfer node, a drain connected to said oscillator, and a source connected to said capacitive circuitry.

5. The apparatus of claim 4 wherein said capacitive circuitry comprises a passive parallel-plate capacitor having a surface area at least an order of magnitude larger than a surface area of said gate.

6. The apparatus of claim 1 wherein said selective charge transfer circuitry comprises a first charge transfer control device having a gate connected to said at least one of said conductive lines, a drain connected to said high voltage generator, and a source connected to said charge transfer node.

7. The apparatus of claim 6 wherein said selective charge transfer circuitry further comprises a second charge transfer control device having a gate and a drain connected to said charge transfer node, and a source connected to said at least one of said conductive lines.

8. The apparatus of claim 1 wherein said conductive line is a word line.

9. An apparatus integrated on a chip for selectively charging conductive lines of a programmable non-volatile memory array, comprising:
    a) a conductive line decoder for selecting at least one of said conductive lines for programming;
    b) a high voltage generator for generating a high voltage;
    c) an oscillator for generating voltage pulses;
    d) a first charge transfer control device having a gate connected to said at least one of said conductive lines, a source connected to said high-voltage generator, and a drain connected to a charge transfer node, for transferring charge from said high-voltage generator to said charge transfer node in response to said voltage pulses received at said charge transfer node;
    e) a second charge transfer control device having a gate and a source connected to said charge transfer node, and a drain connected to said at least one of said conductive lines, for transferring charge from said charge transfer node to said conductive line;
    f) an oscillator output control device having a gate connected to said charge transfer node, a source connected to said oscillator, and a drain, for transmitting said voltage pulses to said drain only if said at least one of said conductive lines is selected; and
    g) a capacitive circuit connected between said drain of said oscillator output control device and said charge control node, for capacitively coupling said voltage pulses to said charge transfer node only if said at least one of said conductive lines is selected.

10. An apparatus integrated on a chip for selectively charging conductive lines of a programmable non-volatile memory array, comprising:
    a) decoder means for selecting at least one of said conductive lines for programming;
    b) high-voltage means for generating a high voltage;
    c) oscillator means for generating voltage pulses;
    d) passive capacitive means for capacitively coupling said voltage pulses to a charge transfer node only if said at least one of said conductive lines is selected for programming; and
    e) selective charge transfer means for selectively transferring charge increments from said high-voltage generator to said at least one of said conductive lines in response to said voltage pulses.

* * * * *